United States Patent [19]

Seyk

[11] Patent Number: 5,255,159
[45] Date of Patent: Oct. 19, 1993

[54] CIRCUIT BOARD SPACER
[75] Inventor: Douglas A. Seyk, Glendale, Ariz.
[73] Assignee: Honeywell Inc., Minneapolis, Minn.
[21] Appl. No.: 603,069
[22] Filed: Oct. 25, 1990
[51] Int. Cl.[5] .............. H05K 7/10; B23K 31/02
[52] U.S. Cl. ............... 361/770; 174/138 D; 174/138 E; 228/180.1; 361/758; 361/808; 361/760
[58] Field of Search .......... 174/138 D, 138 E, 138 G, 174/166 S; 361/400, 417, 419, 403, 397, 418, 420; 403/29, 30, 31, 274, 901-903; 411/909, 913; 29/834, 837, 840, 845; 228/180.1, 180.2

[56] References Cited

U.S. PATENT DOCUMENTS 3,263,200  7/1966  Kocmich ............... 174/138 G

FOREIGN PATENT DOCUMENTS 3418694  11/1985  Fed. Rep. of Germany ...... 361/403
1421167  1/1976  United Kingdom ............ 361/403

OTHER PUBLICATIONS

BiVar Inc. "Dissopad Wash Away Spacers" Oct. 1969.
BiVar Inc. "Component Mounting Spacers, Printed Cricuit Board Card Guides, Card Ejectors and Miniature Terminal Blocks" Code Identification No. 32559 1983.
IBM Technical Disclosure "Transistor Spacer" by N. G. Jones vol. 8 No. 9 Feb. 1966.

*Primary Examiner*—Leo P. Picard
*Assistant Examiner*—Donald A. Sparks
*Attorney, Agent, or Firm*—Howard P. Terry; Dale E. Jepsen; Albin Medved

[57] ABSTRACT

A solder spacer device and method for use in positioning a grid pin array having a plurality of pins over a circuit board having a plurality of pin holes respectively receiving the pins. The spacer is pulled through a central opening in the circuit board after the pins are soldered in the holes to the circuit board. The spacer has a cylindrical body which is positioned in the central opening and has a plurality of radial legs having respective flexure portions for separating the pin grid array from the circuit board during soldering and for folding into the central opening during extraction through the central opening after the soldering is finished.

3 Claims, 5 Drawing Sheets

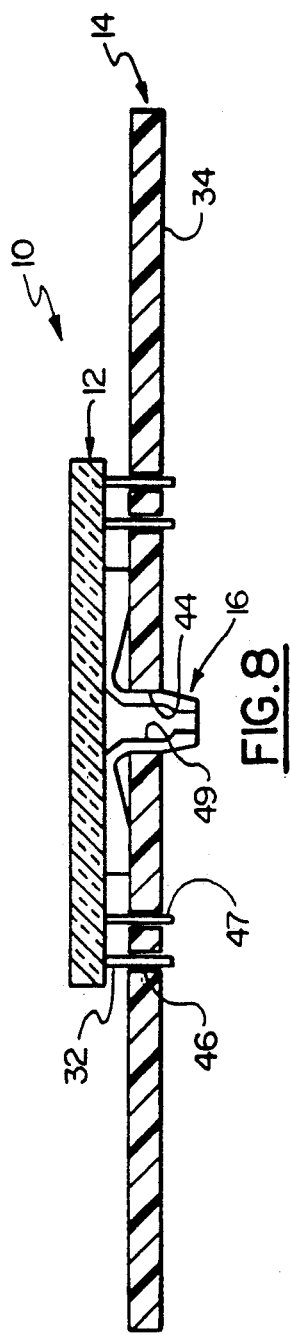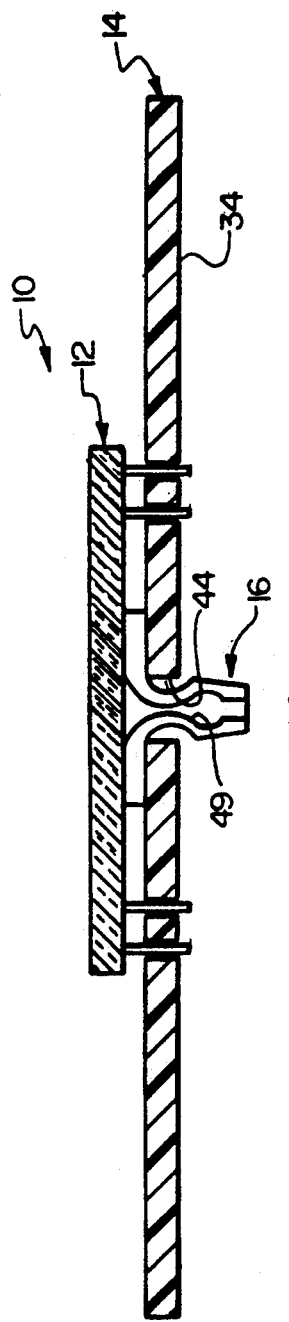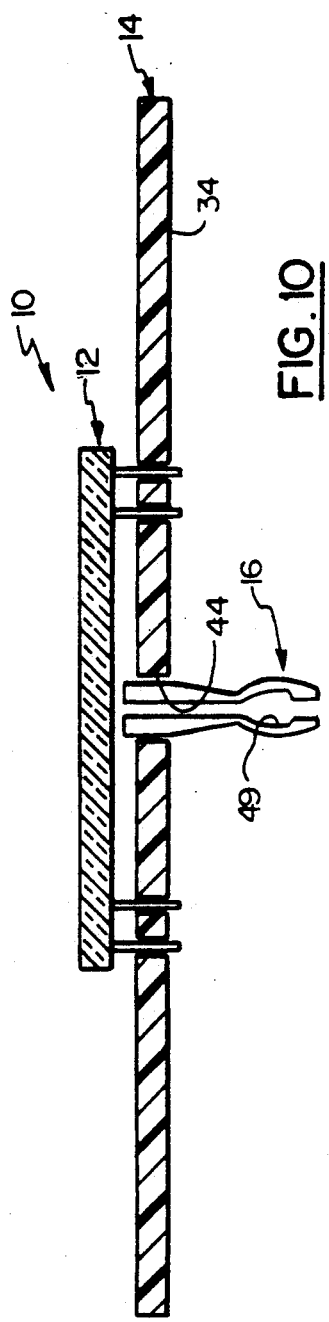

CIRCUIT BOARD SPACER

The invention relates to a circuit board spacer, and in particular the invention relates to a circuit board solder spacer having a cylindrical portion with an inner bearing surface for gripping an extraction tool and having foldable radial legs which permit pulling the spacer through a circuit board opening after a soldering operation.

BACKGROUND OF THE INVENTION

The prior art circuit board spacer includes a doughnut-shaped pad, which is disposed between a top surface of a circuit board and a bottom surface of a pin grid array during and after a soldering of a pin array pin to the circuit board.

One problem with the prior art spacer is that the spacer cannot be removed from the assembly of the pin grid array and the circuit board, which tends to lead to an unacceptable solder joint due to thermal expansion or solder voids.

SUMMARY OF THE INVENTION

According to the present invention, a circuit board spacer is provided. This spacer comprises a cylindrical portion having an inner bearing surface for gripping an extraction tool and having a plurality of foldable radial legs for disposal between a pin grid array and a circuit board during soldering and for folding of the spacer after soldering during extraction.

By using the inner bearing surface, an extraction tool can be inserted through a circuit board opening into the cylindrical portion and can bear against the bearing surface, for extracting the spacer. By using the spider-like foldable radial legs, the legs can be folded into the circuit board opening when extracting the spacer.

The foregoing and other objects, features and advantages will be apparent from the following description of the preferred embodiment of the invention as illustrated in the accompanying drawings.

BRIEF DESCRIPTION OF THE DRAWINGS

FIG. 8 is a section view of the assembly of FIG. 1 after a soldering operation;

FIG. 9 is a section view of the assembly of FIG. 8 during a step in an extraction of spacer;

FIG. 10 is a section view of the assembly of FIG. 9 during a subsequent step in the extraction of spacer.

DESCRIPTION OF THE PREFERRED EMBODIMENT

Figure 1:
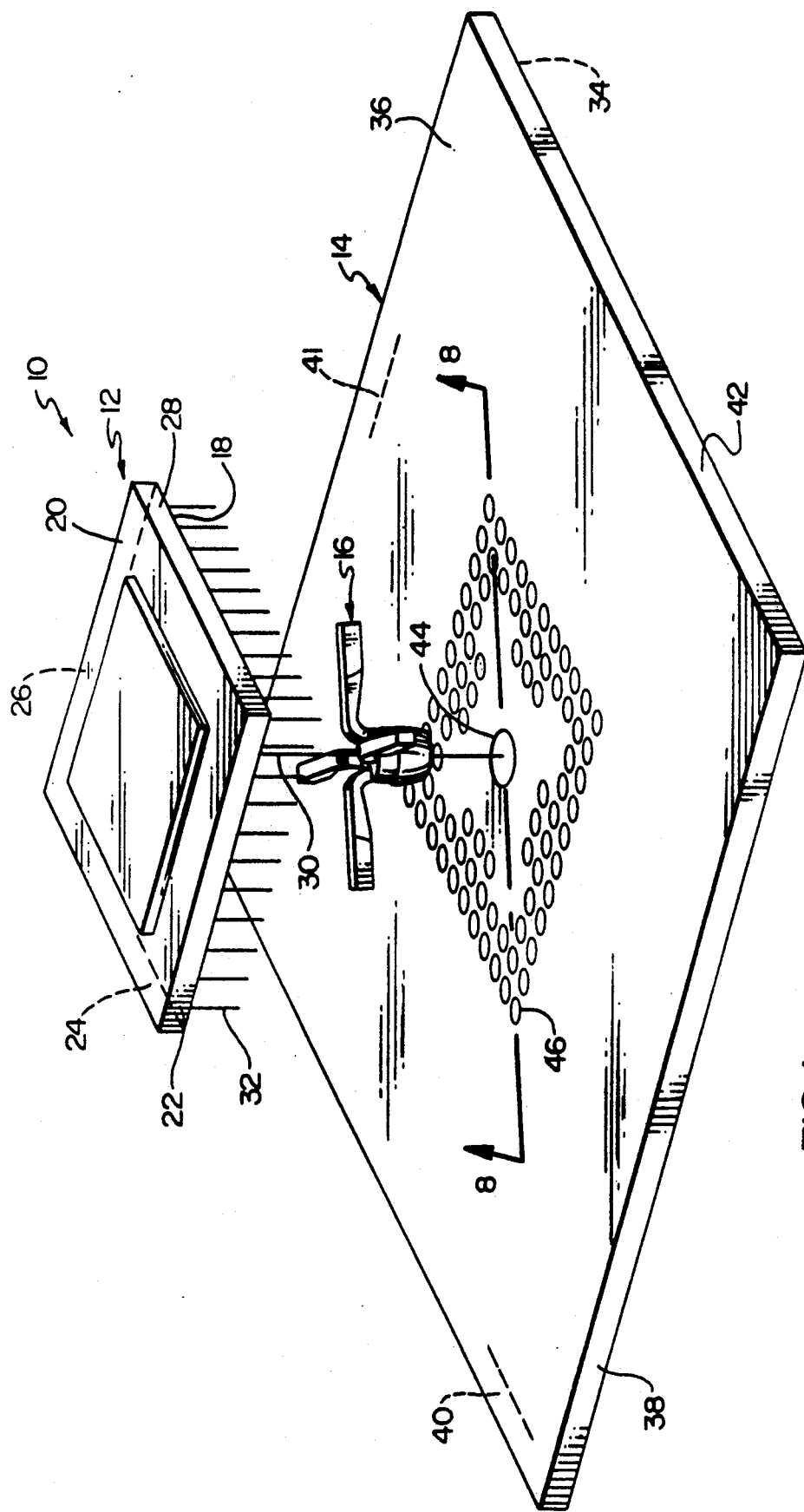
FIG. 1 is an exploded view of a circuit board assembly according to the invention.
Figure 2:
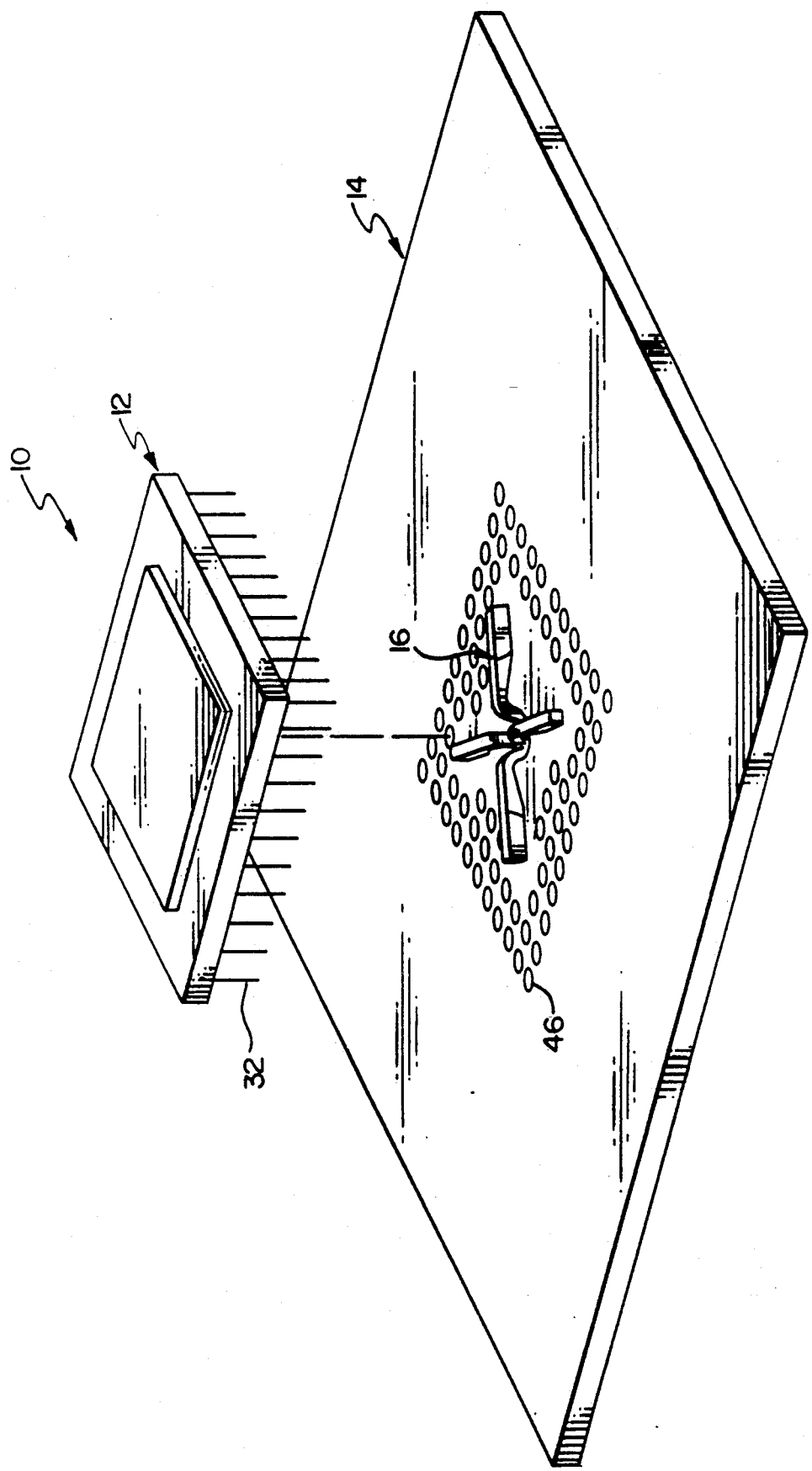
FIG. 2 is another exploded view of the circuit board assembly of FIG. 1.
Figure 3:
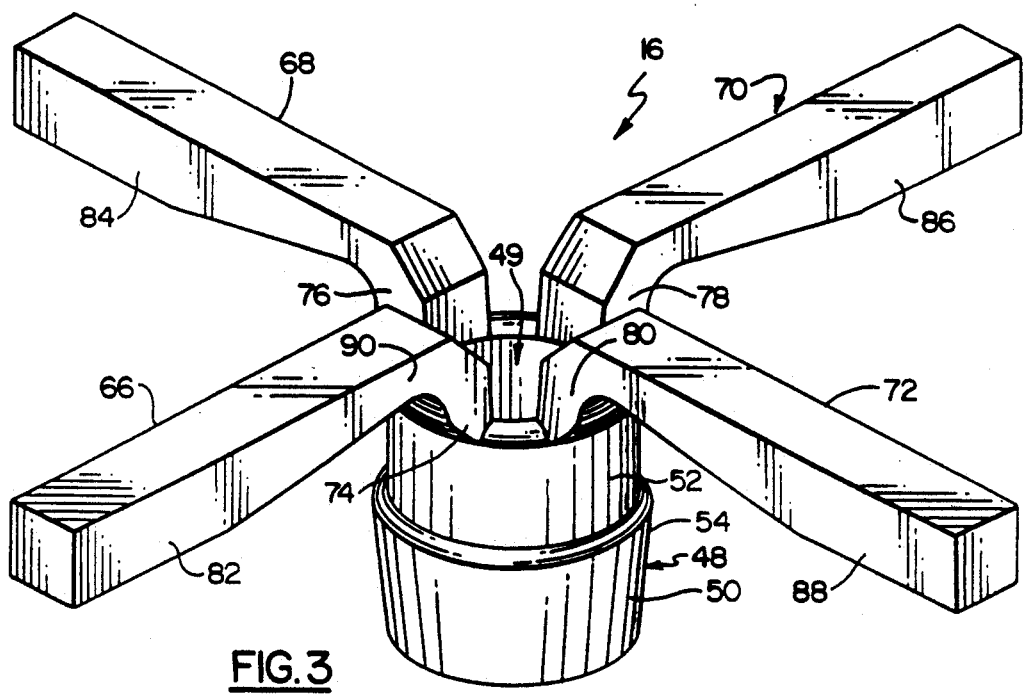
FIG. 3 is a perspective view of a spacer portion of FIG. 1.
Figure 4:
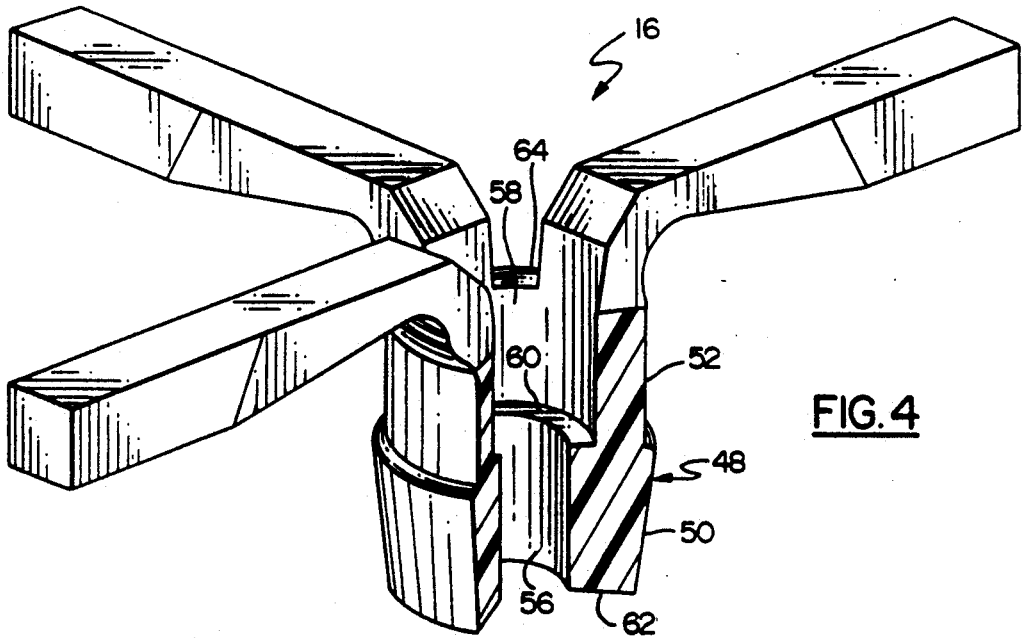
FIG. 4 is a cutaway view of the spacer of FIG. 3.
Figure 5:
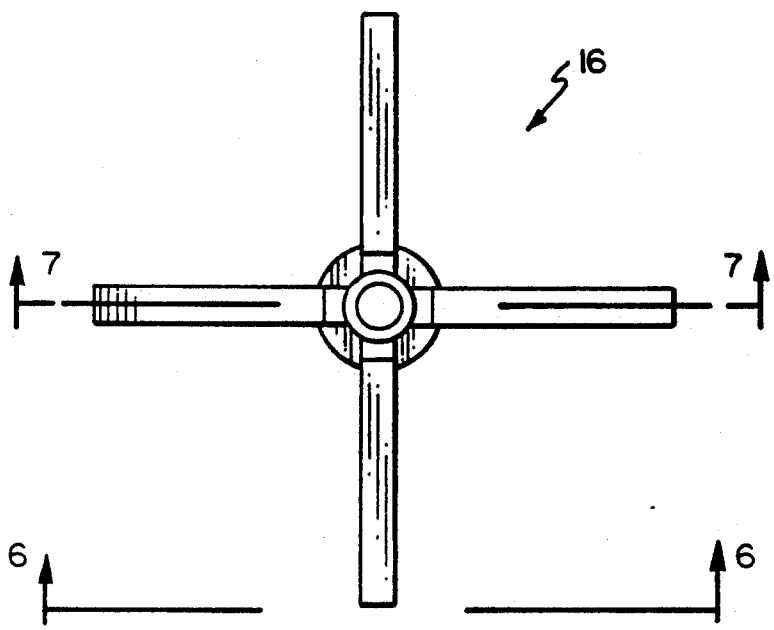
FIG. 5 is a plan view of the spacer of FIG. 4.
Figure 7:
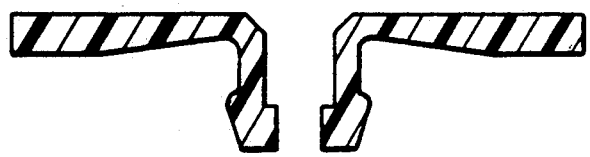
FIG. 7 is a section view as taken along line 7—7 of FIG. 5.
Figure 6:
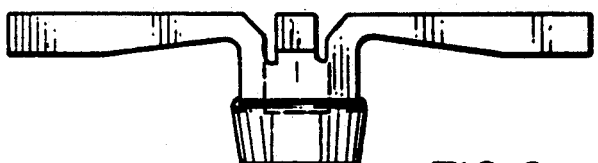
FIG. 6 is an elevation view as taken along line 6—6 of FIG. 5.

As shown in FIGS. 1 and 2, a circuit board assembly 10 is provided. Assembly 10 has a PGA or pin grid array 12, and a PWB or printed wire board or circuit card 14, and a standoff unit or solder spacer 16.

Array 12 has a bottom surface 18, a top surface 20, and a plurality of edges 22, 24, 26, 28. Array 12 has a vertical axis, and has eighty-four identical pins 32, which extend in an axial direction away from bottom surface 18.

Board 14, which is coaxial with array 12, has a lower surface 34, an upper surface 36, and a plurality of sides 38, 40, 41, 42. Board 14 also has a central opening 44, and has eighty-four identical holes 46, which respectively receive pins 32 with solder 47. FIG. 1 shows spacer 16 before disposal in opening 44. FIG. 2 shows spacer 16 after disposal in opening 44.

Figure 11:
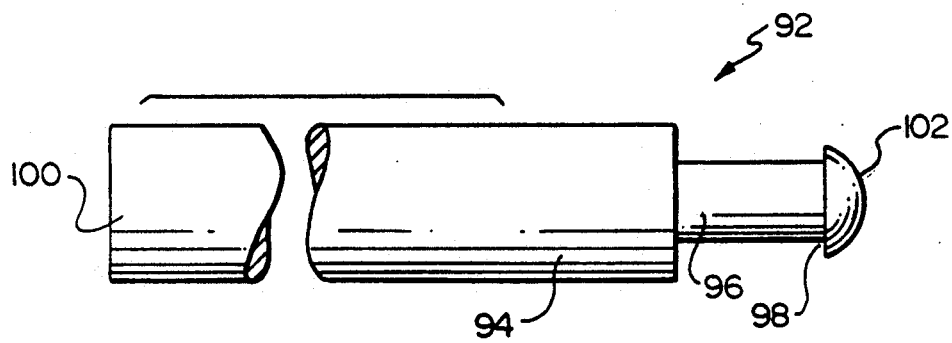
FIG. 11 is an elevation view of an extracting tool for the extraction of spacer.

As shown in FIGS. 3, 4, 5, 6 and 7, spacer 16 has a cylindrical body or cylinder 48, which has an axial aperture 49. Cylinder 48 has two radially outer surfaces 50, 52, which have a step 54 therebetween. Cylinder 48 also has two radially inner surfaces 56, 58, having a step or bearing surface 60 therebetween. Surface 50 is an inclined surface, for ease of entering board opening 44. Cylinder 48 has a bottom face 62 and a top face 64. Cylinder 48 has four L-shaped legs 66, 68, 70, 72, which have respective axial leg portions 74, 76, 78, 80, and which have respective radial leg portions 82, 84, 86, 88. Leg 82, which is identical to legs 84, 86, 88, and which is tapered in thickness, has a relatively thin flexure portion 90. Flexure 90 is disposed adjacent to axial portion 74, for ease of bending or folding leg portion 82 when applying an axial downward force on cylinder 48. Outer step 54 and outer surface 52 form a slight recess. Inner step or bearing surface 60 engages an extraction or removal tool 92, as explained hereafter and as shown in FIG. 11.

As shown in FIGS. 8, 9 and 10, the steps in a process of manufacture using spacer 16 are indicated hereafter:

a) Spacer 16 is inserted into central opening 44 in board 14 prior to placement of array 12.

b) Array 12 is then positioned axially over spacer 16.

c) Board 14 is then wave soldered from lower surface 34, and then cleaned.

d) Removal tool 92 is then inserted into spacer 16 through aperture 49 from the solder side or lower surface 34 of board 14.

e) Spacer 16 is then pulled through central opening 44 in board 14.

As shown in FIG. 11, tool 92 has a handle portion 94, which may be covered by a screwdriver handle or the like. Tool 92 also has a recess portion 96, a bearing surface 98, a flat bottom end face 100, and an arcuate top end face 102. Top face 102 and recess portion 96 are inserted into spacer aperture 49. Bearing surface 98 partly bears against bearing step 60. A downward force on tool 92 pulls spacer 16 from opening 44.

The advantages of assembly 10 and spacer 16 are indicated hereafter:

A) Spacer 16 snaps into board central opening 44 underneath array 12. After soldering, spacer 16 can be removed from assembled array 12 and board 14.

B) Spacer 16 avoids the problems of thermal expansion mismatch, causing solder voids, and the like.

C) Spacer 16 fully supports array 12 during a solder flow process without interfering with any leads or pins 32.

D) Array 12 can have leads or pins 32 on all four sides.

E) Spacer 16 avoids the need of a permanent spacer disposed between array 12 and board 14.

F) Spacer 16 does not interfere with the area around each pin 32.

G) Spacer 16 cannot be broken or lost within assembly 10.

H) Spacer 16 is a temporary process item and is removed from assembly 10 after the soldering process is finished.

I) Tool 92 can be manually operated. In this embodiment, the spacer outer diameter across legs 82, 86 is about 0.750 inches, and the thickness of spacer leg 82 is about 0.050 inches at its radially outer end, and the outer diameter of cylinder 48 is about 0.150 inches.

J) Spacer 16 can be made from readily available material. In this embodiment, the material of spacer 16 is a teflon material, for example.

While the invention has been described in its preferred embodiment, it is to be understood that the words which have been used are words of description rather than limitation and that changes may be made within the purview of the appended claims without departing from the true scope and spirit of the invention in its broader aspects.

The embodiments of an invention in which an exclusive property or right is claimed are defined as follows:

1. A circuit board spacer, for placement between a pin grid array with a plurality of pins and a circuit board with respective pin holes during a soldering of the pins at the pin holes to the circuit board and for placement in a central opening of the circuit board, comprising:
   a cylindrical body for insertion partly in the central opening and having an axis and an axial aperture and a radially outer surface and a radially inner surface and a first axial end face and a second axial end face; and
   a plurality of radial legs each having a radial leg portion which is connected to an axial leg portion that is connected to the second axial end face; wherein
   the radial leg portion has a hinge-like flexure portion for ease of bending the radial leg portion from a radial direction to an axial direction; and wherein
   the radially inner surface has a step portion having a bearing surface for bearing against a bearing surface of an extraction rod.

2. The spacer of claim 1, wherein the cylindrical body has a removable extraction rod having a handle portion and a top end face and a bottom end face and a recess portion having a bearing surface for engaging the spacer bearing surface upon insertion in the aperture and during an extraction of the spacer from the circuit board and pin grid array after the soldering of the pins, or for removal from the aperture before the soldering of the pins if assembled.

3. A circuit board assembly comprising:
   a pin grid array having an axis and having a plurality of pins;
   a circuit board coaxial with the pin grid array and having a plurality of holes respectively receiving the pins for soldering the pins at the pin holes to the circuit board and having a central opening coaxially disposed along the axis; and
   a standup spacer having a cylindrical body coaxially disposed in the central opening and having a plurality of radial legs each disposed between the pin grid array and the circuit board; wherein
   the cylindrical body has an aperture extending along the axis and a radially outer surface and a radially inner surface and a first axial end face and a second axial end face; and wherein
   the plurality of radial legs each has a radial leg portion and an axial leg portion, said axial leg portion connecting to the radial leg portion at a racially outer part thereof and connecting to the cylindrical body at a radially inner part thereof; and wherein
   each radial leg portion has a flexure portion; and wherein
   the radially inner surface of the cylindrical body has a step portion with a bearing surface.

* * * * *